United States Patent
Cok (10) Patent No.: US 7,368,307 B2
(45) Date of Patent: May 6, 2008

(54) METHOD OF MANUFACTURING AN OLED DEVICE WITH A CURVED LIGHT EMITTING SURFACE

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 267 days.

(21) Appl. No.: 11/146,865

(22) Filed: Jun. 7, 2005

(65) Prior Publication Data

US 2006/0273304 A1    Dec. 7, 2006

(51) Int. Cl.
*H01L 51/56* (2006.01)
(52) U.S. Cl. .................. 438/26; 438/99; 438/126; 257/E33.059; 313/506
(58) Field of Classification Search .......... 438/26
See application file for complete search history.

(56) References Cited

U.S. PATENT DOCUMENTS

| | | | |
|---|---|---|---|
| 4,271,584 A * | 6/1981 | Zaeschmar | 438/26 |
| 5,650,363 A * | 7/1997 | Endroes et al. | 438/57 |
| 5,652,930 A | 7/1997 | Teremy et al. | |
| 6,197,418 B1 | 3/2001 | Cloots et al. | |
| 7,113,661 B2 * | 9/2006 | Arai et al. | 385/14 |
| 2002/0001046 A1 | 1/2002 | Jacobsen et al. | |
| 2003/0062830 A1 | 4/2003 | Guenther et al. | |
| 2003/0134488 A1 * | 7/2003 | Yamazaki et al. | 438/455 |
| 2003/0162312 A1 * | 8/2003 | Takayama et al. | 438/22 |
| 2003/0184704 A1 | 10/2003 | Akiyama et al. | |
| 2004/0135160 A1 | 7/2004 | Cok | |

FOREIGN PATENT DOCUMENTS

| JP | 2005-142060 A * | 6/2005 |
|---|---|---|
| WO | WO 03/020545 | 3/2003 |

* cited by examiner

*Primary Examiner*—Stephen W. Smoot
(74) *Attorney, Agent, or Firm*—Andrew J. Anderson; Stephen H. Shaw (57) ABSTRACT

A method of manufacturing an OLED device with a curved light-emitting surface comprising:

a) forming a flexible substrate and providing the flexible substrate in a flat configuration;

b) forming one or more OLEDs having a first electrode, one or more layers of organic material, at least one of which is light emitting formed over the first electrode, and a second electrode formed over the one or more layers of organic material, on the substrate;

c) forming a rigid, curved, encapsulating cover;

d) conforming the flexible substrate, electrodes, and one or more layers of organic material to the rigid, curved, encapsulating cover; and e) sealing the conformed flexible substrate, electrodes, and one or more layers of organic material to the rigid, curved, encapsulating cover.

13 Claims, 5 Drawing Sheets

METHOD OF MANUFACTURING AN OLED DEVICE WITH A CURVED LIGHT EMITTING SURFACE

FIELD OF THE INVENTION

The present invention relates to OLED devices and, more particularly, to OLED devices having a curved format.

BACKGROUND OF THE INVENTION

Light-emissive devices are well known and used for a wide variety of purposes, including area illumination and the representation of information in displays. Traditionally, these light-emissive devices rely on evacuated glass enclosures within which are special gases, phosphors, or filaments that emit light upon the application of a current or when stimulated with an electron. More recently, solid-state light-emissive devices have created robust, long-lived, and practical displays using, for example, light-emitting diodes, liquid crystal, and plasma technologies.

Light emissive devices are useful in a variety of forms. Traditional forms include bulbs rounded in one or two dimensions, for example incandescent and fluorescent light bulbs. Neon lighting is often linear and is used to create lines of light through three dimensions. Large-format information displays such as cinemas rely upon curved screens to maintain an immersive experience for viewers and to more readily simulate a real-world environment. Hence, conventional light-emissive and display devices are found with a variety of shapes, including flat, curved in one or two dimensions, and linear.

Conventional high-output light-emitting solid-state diodes utilize light emitting diodes, typically point sources mounted into a substrate. Because individual devices are individually mounted, these devices can be mounted onto a variety of substrates with a variety of shapes. However, because these devices utilize a collection of point light sources, they require additional optical devices such as mirrors and lenses for suitable area illumination. When applied to information display, individually mounted light emitting diodes are expensive and only suitable for low-resolution displays.

Flat-panel solid-state information display devices such as liquid crystal, OLED, and plasma display devices provide good resolution. Such devices are typically built upon flat substrates, typically glass or silicon, and encapsulated with glass cover layers to provide desired environmental protection. Such structures are typically very rigid and difficult to employ in a curved configuration. The use of flexible substrates and covers for displays, typically plastic, is also known and there is increased interest in flexible, light-emitting, solid-state displays and area illuminators. Such devices typically rely upon constructing a flexible, flat light-emissive device on a flexible substrate and with a flexible cover, and then bending the device to meet the needs of an application. Typically, problems such as cracking and moisture permeation are encountered in such flexible devices.

Figure 2:
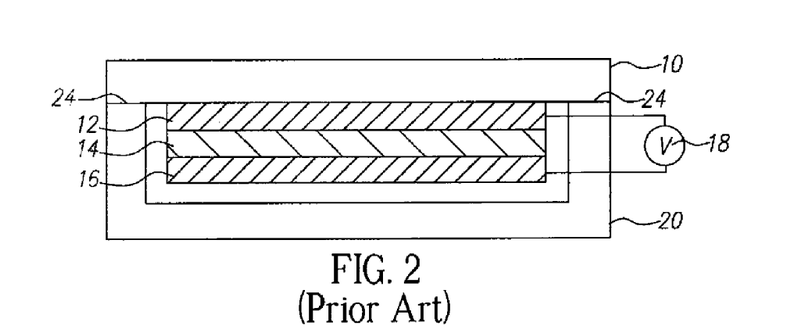
FIG. 2 is a cross section of a prior-art OLED device having a planar substrate.

Referring to FIG. 2, a prior-art OLED device includes an organic light-emitting layer 14 disposed between two electrodes 12 and 16, e.g. a cathode and an anode. The organic electro-luminescent layer 14 emits light upon application of a voltage from a power source 18 across the electrodes. The OLED element typically includes a substrate 10 comprising a material such as glass or plastic and is encapsulated with a cover 20. It will be understood that the relative locations of the anode and cathode may be reversed with respect to the substrate. The organic light-emitting layer 14 may include other layers such as electron or hole injection layers as is known in the art. Typically, one of the two electrodes 12 or 16 and either the cover 20 or substrate 10 is transparent to allow emitted light to escape from the OLED device. The other electrode is usually reflective.

In general, glass is employed as the substrate for solid-state displays and many illuminators. The specific properties of glass make it a suitable substrate for carrying electro-conductive layers in electric or semiconductor devices such as flat-panel displays, electro-luminescent panels, cathode ray tubes (CRTs), photovoltaic cells, etc. In addition to a high thermal and dimensional stability, glass has many other beneficial properties compared to plastic materials, e.g. the ease of recycling, excellent hardness and scratch resistance, high transparency, good resistance to chemicals such as organic solvents or reactive agents, low permeability of moisture and gases, and a very high glass transition temperature, enabling the use of high-temperature processes for applying an electro-conductive layer. However, the main problems associated with the use of glass as a substrate in electric or semiconductor devices are its high specific weight, brittleness and limited flexibility. The latter problems require the coating of a functional layer on glass to be typically carried out in a batch process (sheet by sheet).

A common alternative to glass for flexible substrates is plastic. Plastic is typically very flexible, shock resistant, and light weight, but is also porous and many light-emitting materials, for example OLEDs are sensitive to environmental contamination that may permeate a plastic substrate. However, the application of layers on a plastic support is generally performed as a continuous process, e.g. by using a web coater or continuous printing techniques such as screen or offset printing, providing improved productivity and cost efficiency.

For some applications, plastic foils may be used as a substrate for carrying electroconductive layers in spite of the many disadvantages compared to glass. The high permeability of oxygen and water through plastic substrates degrades the electroconductive layers rapidly. Some progress has been made on producing plastic foils with barrier layers to limit permeability; however the lifetime of electric devices in which such plastic foils are used is still limited and needs to be improved. In addition, an inorganic conducting layer such as indium-tin oxide (ITO) is brittle and as a result, the electroconductivity of an ITO layer is susceptible to deterioration by simply bending a flexible plastic substrate. All these effects limit the lifetime of such flexible plastic substrate based devices considerably. Other problems associated with plastic substrates include inorganic electroconductive layers such as ITO may require an annealing step at an elevated temperature which is not compatible with most plastics.

A variety of solutions are proposed to overcome the problems and provide some of the advantages recited above. For example, U.S. Pat. No. 6,197,418 entitled "Electroconductive glass laminate" discloses a material that comprises a substrate and an organic electroconductive layer provided on said substrate, characterized in that the substrate is a laminate comprising a glass layer and a support. The glass layer is preferably a flexible glass layer having a thickness from 10 to 500 μm. The material can be used as an electrode in electric or semiconductor devices thereby providing an improved lifetime, e.g. displays, photovoltaic cells or light-emitting diodes. US20030062830 entitled "Reinforcement of glass substrates in flexible devices" describes a reinforcement technique used in the fabrication of displays, such as organic light emissive diode displays. A stiff reinforcement lid is mounted on a thin substrate to encapsulate the OLED cells. The lid serves to reinforce the thin flexible substrate and protect it from breakage. It comprises preferably of metal or other materials that have higher stiffness and ductility than the thin substrate. The fabricated display is compatible for integration into chip cards and other flexible applications.

US20020001046 A1 entitled "Apparatuses and methods for forming assemblies" describes various means to form flexible active-matrix displays along a length of flexible substrate. Another embodiment of the invention relates to forming multiple flexible displays along a continuous flexible substrate. Another embodiment of the invention relates to forming a flexible display along a flexible reflective substrate.

US20030184704 entitled "Display Device and Method of Manufacturing the Same" describes a display device comprising a first plastic substrate, a first adhesion layer formed in a first region of the first plastic substrate, the first region being a region where a pixel region is to be formed thereon, a second adhesion layer formed in a peripheral region outside of the first region of the first plastic substrate, a first thin glass layer formed on the first and second adhesion layers, a plurality of active elements formed on the first thin glass layer in one-to-one relation with a plurality of pixels, a display part formed on the first thin glass layer, the display part corresponding to the pixel region and being driven by the plurality of active elements, and an opposing substrate formed over the display part. Such laminated structures can provide a more environmentally tolerant substrate with a greater flexibility. Nonetheless, continuous flexing of such structures can lead to failure and may not provide the process compatibility necessary for OLED display processing.

In many applications, flexibility over time is not necessary so that a flexible display screen may be coupled to a substrate to provide a conformable display that is fixed in shape. Hence, the display screen is flexed only a limited number of times before being fixed in position. For example, WO2003020545 entitled "Conformable Vehicle Display" discloses a conformable vehicle display that includes a flexible display screen coupled to a substrate. The substrate is a curved transparent substrate that is adapted to be coupled to a vehicle component having a curved exterior surface. The flexible display screen is at least partially separate from the exterior surface of the vehicle component and has a luminescent display. The exterior surface of the vehicle component is visible through the flexible display screen and the substrate when the flexible display screen is not activated. The flexible display screen may be a transparent organic light emitting diode display device. However, such a design still requires that an entire display screen itself be flexible, and therefore suffers from the same environmental exposure and lifetime problems found in the OLED flexible display art.

U.S. Pat. No. 5,652,930 discloses a curved information display may be adapted as an exterior display conforming to curved surfaces of a camera casing. In such embodiment, organic electroluminescent material is applied in predetermined patterns to a flexible support, and the flexible support is applied to a rigid support, such as the camera casing or other structure conforming to the shape of the camera casing. The electroluminescent patterns are then coupled electrically to a camera control for selectively applying voltages to the patterns, causing the patterns to luminesce. The flexible display is described as comprising a transparent flexible substrate, and a first transparent conductor, an organic electroluminescent pattern layer, and a second transparent conductor, respectively, coated or otherwise deposited on the flexible substrate, along with a sealing layer 208 applied for mechanical and environmental protection. Such flexible display design still fails to teach encapsulation of a curved display in a manner that solves the environmental exposure and lifetime problems found in the OLED flexible display art.

In an alternative approach to making a curved display or illuminator, a curved, rigid substrate may be employed having the desired display shape, and the materials comprising the device are formed directly on the curved substrate. Such a manufacturing process is described in US2004/0135160. Most display manufacturing equipment, however, is designed for planar surfaces so that the deposition of materials on a curved surface is difficult and the manufacturing infrastructure for supporting such deposition is not available.

There is a need therefore for an improved process for making solid-state OLED light emissive devices having a curved display surface for area illumination or information presentation.

SUMMARY OF THE INVENTION

In accordance with one embodiment, the present invention is directed towards a method of manufacturing an OLED device with a curved light-emitting surface comprising:

a) forming a flexible substrate and providing the flexible substrate in a flat configuration;

b) forming one or more OLEDs having a first electrode, one or more layers of organic material, at least one of which is light emitting formed over the first electrode, and a second electrode formed over the one or more layers of organic material, on the substrate;

c) forming a rigid, curved, encapsulating cover;

d) conforming the flexible substrate, electrodes, and one or more layers of organic material to the rigid, curved, encapsulating cover; and e) sealing the conformed flexible substrate, electrodes, and one or more layers of organic material to the rigid, curved, encapsulating cover.

ADVANTAGES

The present invention has the advantage that it can provide an OLED device having a curved emission surface while employing manufacturing equipment that form OLEDs in a flat configuration. The curved emission surface may be advantageously employed in an area illumination light or in a display.

DETAILED DESCRIPTION OF THE INVENTION

Figure 9:
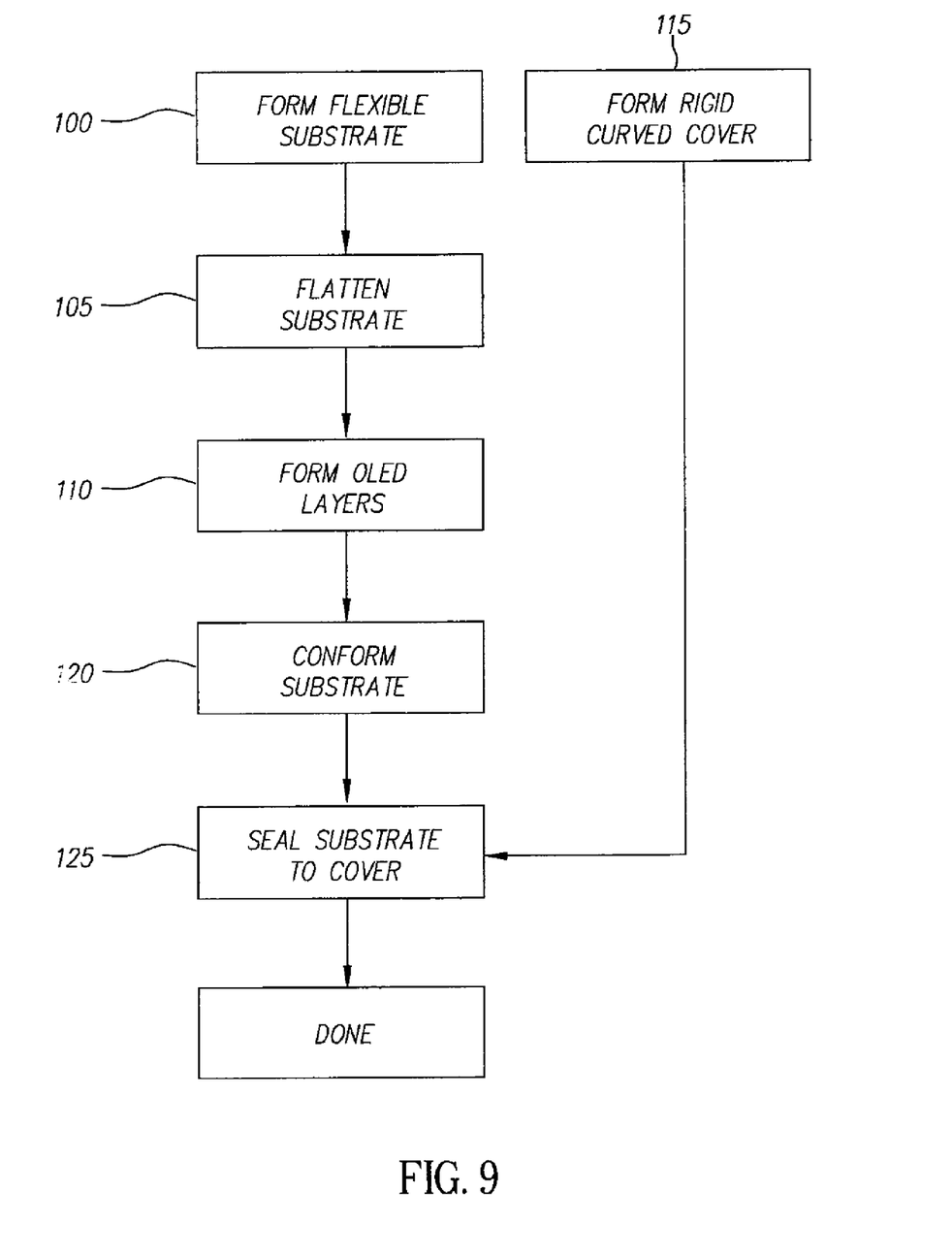
FIG. 9 is a flow diagram illustrating the method of the present invention.

Referring to FIG. 9, a method of manufacturing an OLED device with a curved light-emitting surface comprises the steps of forming 100 a flexible substrate; flattening 105 the flexible substrate to provide the flexible substrate in a flat configuration; forming 110 one or more OLEDs having a first electrode, one or more layers of organic material, at least one of which is light-emitting formed over the first electrode, and a second electrode formed over the one or more layers of organic material, on the flexible substrate while in the flat configuration; forming 115 a rigid, curved, encapsulating cover; conforming 120 the flexible substrate, electrodes, and one or more layers of organic material to the rigid, curved, encapsulating cover; and sealing 125 the conformed flexible substrate, electrodes, and one or more layers of organic material to the rigid, curved, encapsulating cover. The process is then complete.

The formation of substrates and covers suitable for the present invention are well known, as are manufacturing processes suitable for the deposition of electrodes and organic material layers on flat surfaces. The rigid, curved encapsulating cover and the flexible substrate may be formed in any order and are preferably provided at the start of the manufacturing process for the OLEDs.

The flexible substrate must be provided in a flat configuration before the deposition of the electrodes and organic layers. The flexible substrate may be formed with a flat surface so that the step of flattening the substrate before the deposition of OLED layers is not necessary. In this case, force must be applied to bend the surface to conform to the rigid, curved substrate before the substrate is sealed to the cover. Alternatively, the flexible substrate may be formed with a curved surface so that the step of flattening the substrate before the deposition of OLED layers requires force. In this alternative case, force may not need to be applied to conform the flexible substrate to the rigid, curved encapsulating cover before the flexible substrate is sealed to the rigid, curved encapsulating cover, if the substrate and cover have a similar curvature.

Figure 1:
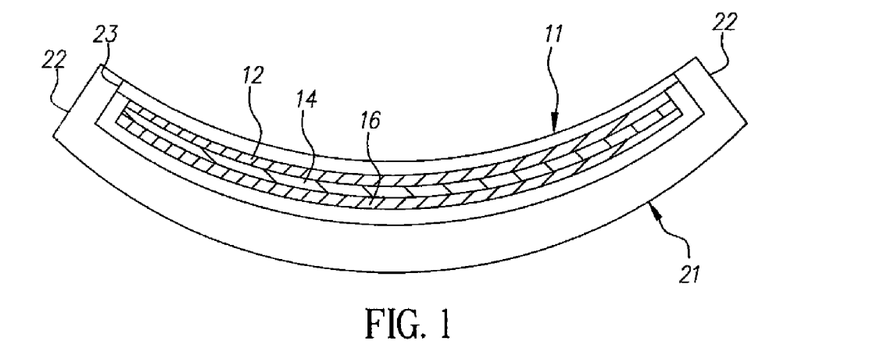
FIG. 1 is a cross section of an OLED having a curved light-emitting surface according to one embodiment of the present invention.

Referring to FIG. 1, one embodiment of an OLED device made according to the method of the present invention includes a curved flexible substrate 11 on which is formed an OLED having a first electrode 12. Over the first electrode is deposited one or more layers 14 of organic materials, at least one of which is light emitting. Over the organic layers 14 is formed a second electrode 16. Substrate 11 is adhered to edges 22 of rigid, curved encapsulating cover 21. At least one of the electrodes 12 or 16 and either the rigid, curved encapsulating cover 21 or curved, flexible substrate 11 is transparent. The other electrode is typically reflective. The organic layers 14 may include layers such as electron-injection or hole-injection layers as is known in the art. One of the organic layers 14 emits light upon application of a voltage from a power source across the electrodes 12 and 16. As noted in the method described above, the electrodes 12 and 16 and the organic layers 14 are deposited on the flexible substrate 11 when it is flat. By positioning the OLEDs between the substrate and encapsulating cover, the OLED materials are protected from exposure to the environment. In accordance with the invention, encapsulating seals between the cover and substrate may be made with materials typically employed in the art.

Figure 6A:
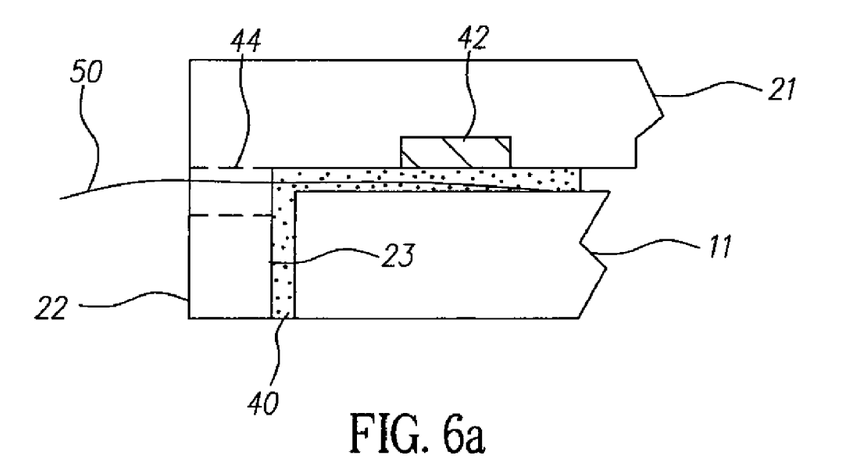
FIGS. 6a and 6b are cross sections of an edge according to various embodiments of the present invention.
Figure 6B:
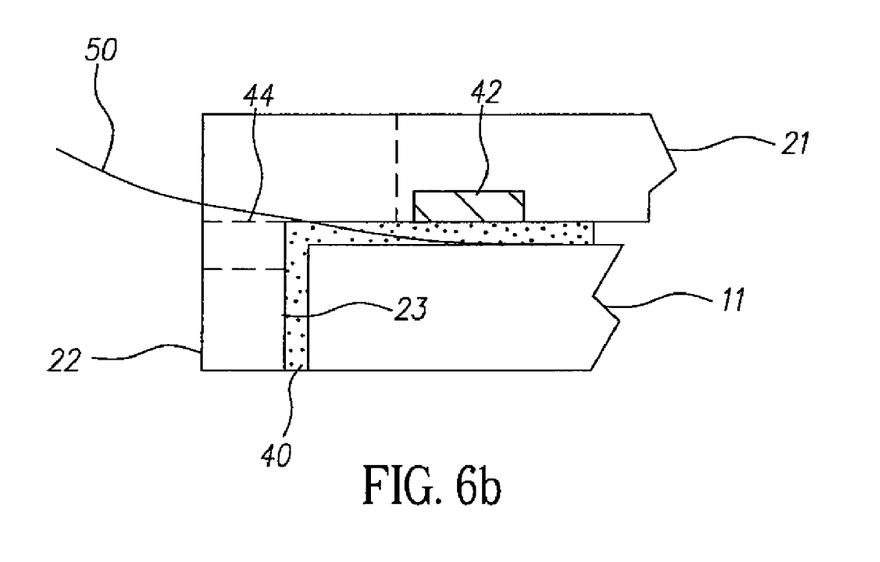

Raised edges 22 located opposite sides of the rigid, curved encapsulating cover 21 are illustrated in greater detail in FIGS. 6a and 6b. Outside edges of the flexible substrate 11 are positioned adjacent to an inside surface 23 of each raised edge 22. If force is needed to bend the flexible substrate 11 to conform to the rigid, curved encapsulating cover, the raised edge 22 may serve to hold the flexible substrate 11 in position. The raised edge 22 may also be formed on all four sides of the rigid, curved encapsulating cover 21, with the outside edge of each side of the flexible substrate positioned adjacent to the corresponding inside surface of the raised edge 22 so as to improve the encapsulation of the organic material layers 14 and electrodes 12 and 16 and to improve the rigidity of the OLED device.

The flexible, conformed substrate 11 may be sealed to the rigid, curved encapsulating cover 21 with an adhesive 40, for example a curable epoxy, located on the perimeter of the flexible, curved substrate 11. As illustrated in FIGS. 6a and 6b, the adhesive may be deposited both on the inside of the raised edge 22 on surface 23 and the surface and edge of the substrate 11 to provide good adhesion, mechanical stability, and environmental protection. Adhesive 40 providing a low permeability to moisture are known in the art, such as epoxies, and are preferably used to provide effective encapsulating seals. Most OLED devices are sensitive to moisture or oxygen, or both, so they are commonly sealed in an inert atmosphere such as nitrogen or argon, along with a desiccant 42 such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Typically, connecting wires 50 electrically connect the OLED device to an external controller. These connecting wires 50 are usually soldered to electrically conductive traces formed on the substrate of the OLED device and must be accessible by external controllers and power supplies. These connecting wires 50 may be routed through an opening 44 in the raised edge of the rigid, curved encapsulating cover 21. The opening 44 may be a hole in the raised edge 22 of the rigid curved encapsulating cover 21 (as shown with dashed lines in FIG. 6a), or may be a gap in the main surface of the rigid curved encapsulating cover 21 (as shown with dashed lines in FIG. 6b). Other arrangements are also possible. For example, the gap between the flexible substrate 11 and the rigid curved encapsulating cover 21 may be enlarged at the location of the connecting wires 50 to enable passage of the connecting wires 50 and the adhesive 40 may be employed to additionally affix the connecting wires 50 to the OLED device and provide environmental protection in the vicinity of the connecting wires 50.

Figure 7:
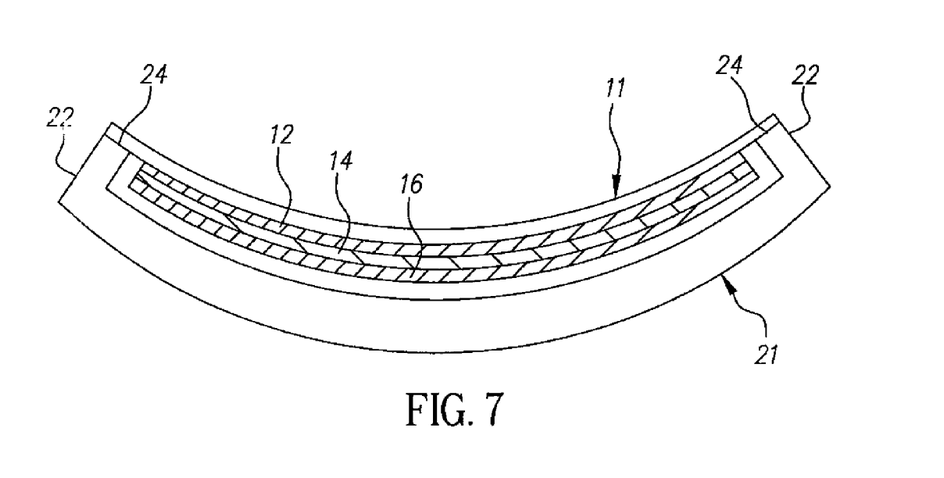
FIG. 7 is a cross section of an OLED having a curved light-emitting surface according to still another embodiment of the present invention.

Alternatively, as depicted in FIG. 7, the bottom surface 24 of the raised edge 22 may be affixed to the main surface of the substrate 11 rather than the outside edge. This arrangement, with a flat substrate 10 and cover 20, is also shown in prior-art FIG. 2. It is also known in the art to provide encapsulating covers without raised edges.

Figure 3:
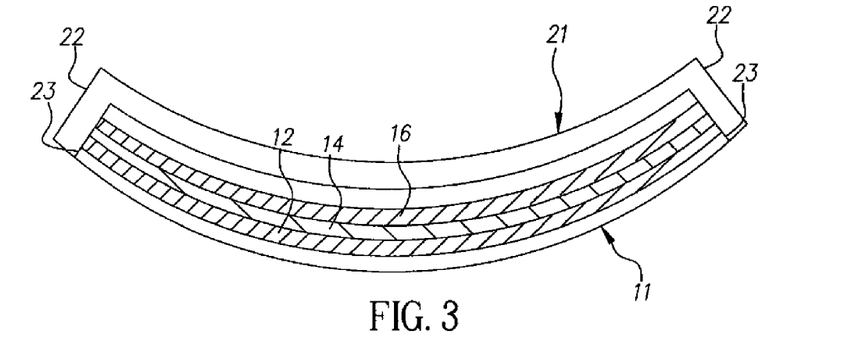
FIG. 3 is a cross section of an OLED having a curved light-emitting surface according to an alternative embodiment of the present invention.

The flexible, curved substrate 11 may be positioned and conformed to the curved cover so that either the OLED layers 14 and electrodes 12 and 16 are on a concave side of the curved cover (as shown in FIG. 1) or on a convex side of the curved cover (as shown in FIG. 3). In either configuration, either a bottom-emitter or a top-emitter OLED device configuration may be employed.

It may be preferred to ensure that the edges of the rigid, curved encapsulating cover are flush with the corresponding edges of the flexible substrate 11 when the flexible substrate 11 is bent. This may be accomplished by forming the flexible substrate 11 with a size and edges such that when the flexible substrate is bent, the edges of the flexible substrate 11 are in a plane with the edges of the rigid, curved encapsulating cover 21. Means to accomplish this are well known in the manufacturing art.

As noted above, OLED devices typically utilize substrates and covers of glass and plastic. While glass substrates are less flexible than most plastic materials, many applications may only require an OLED device with a relatively modest curvature, so a relatively thin glass material may be employed for the flexible substrate. Examples of such applications may include panoramic displays, desktop displays, computer monitors, and some area illumination light sources. Applicants have determined that the requirements of these applications may be met using commercially available glass materials, ITO electrodes, and OLED materials. In these applications, stress due to bending an OLED device formed on a substrate does not result in significant damage to the materials deposited on the substrate. For example, for such applications requiring only modest curvature, it is preferred that flexible substrate 11 comprise thin glass (for example less than 0.5 mm thick), and that the rigid, curved cover 21 comprise relatively thicker glass. While the rigid, curved cover 21 will be thicker than the flexible substrate 11 if they are made of the same materials, the actual possible thicknesses of the rigid curved encapsulating cover 21 and flexible substrate 11 will vary depending on the amount of curvature required for a specific application. A glass material is preferred for the substrate of OLED devices because it is already established that glass provides a much more stable, flat surface resistant to high temperatures and environmental stress such as humidity. Relatively thin glass may be employed as the flexible substrate in the present invention, at a thickness that allows it to be bent to conform to a relatively rigid encapsulating cover. Typically, once the rigid encapsulating cover is affixed to the substrate, the combination becomes even more rigid and difficult to bend than even the cover itself.

Figure 4:
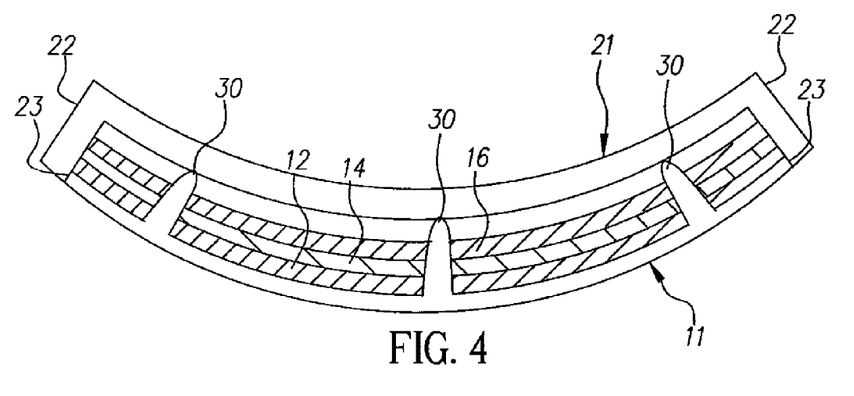
FIG. 4 is a cross section of an OLED having a curved light-emitting surface and raised areas on the substrate according to another embodiment of the present invention.
Figure 5:
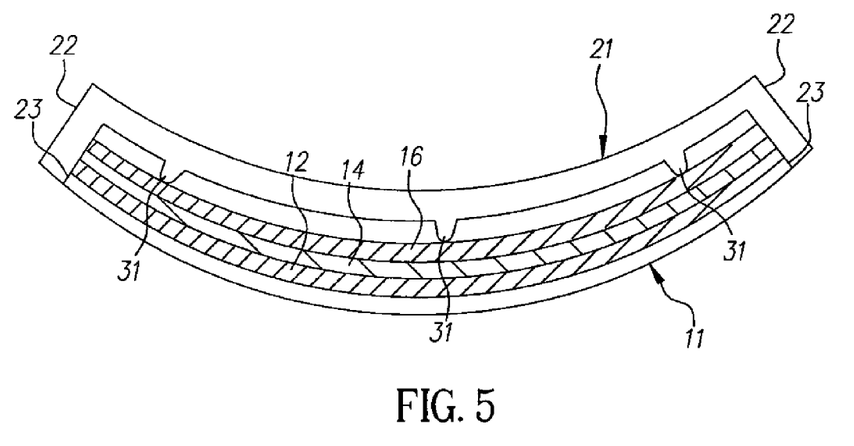
FIG. 5 is a cross section of an OLED having a curved light-emitting surface and raised areas on the cover according to yet another embodiment of the present invention.

In a further embodiment of the invention, spacers may be located between the OLEDs and a main surface of the rigid, curved encapsulating cover to prevent the OLEDs from contacting the main surface of the encapsulating cover. Referring to FIG. 4, e.g., raised areas which project over the OLEDs may be formed over the flexible substrate 11 to prevent the OLEDs from contacting the rigid, curved encapsulating cover 21. These raised areas 30 may be made of, for example, silicon oxides, silicon nitrides, or cured photo-resists and are structured using conventional photolithographic means. The raised areas 30 serve to provide increased rigidity to the OLED device and to protect the electrode 16 from contacting the inside of the rigid, curved encapsulating cover 21 if the cover 21 or the flexible substrate 11 is deformed by external pressure. This is particularly helpful for large OLED devices since the electrode 16 and the inside of the rigid, curved encapsulating cover 21 are relatively close together (for example, less than 50 microns) and only a small external pressure may be necessary to deform the cover or substrate sufficiently to contact the electrode 16 and the rigid, curved encapsulating cover 21. Alternatively, referring to FIG. 5, the raised areas 31 may be formed over and located on the main surface of the rigid, curved encapsulating cover. In this case, the raised areas may be formed using methods known in the manufacturing arts, for example the raised areas 31 may be molded into place as the cover is made or screen printed on. A wide variety of materials may comprise the raised areas 31, for example glass, cured epoxy, or cured photo-resist. In a further alternative, the spacers may be formed separately and subsequently located over the OLEDs. In any case, the raised areas 30 or 31 or separately formed spacers may be coated with an adhesive to adhere the rigid, curved encapsulating cover 21 to the raised areas so that the rigid, curved encapsulating cover 21 may be affixed to the flexible substrate 11 (FIG. 4), or to the electrode 16 (FIG. 5), to provide greater rigidity and stability to the OLED device. Preferably, the raised areas 30 or 31 are located in areas of the OLED device that do not emit light, for example between pixels or over conductors, transistors, or the like. The raised areas 30 or 31, while not generally expected to emit light, may also be coated with organic layers 14 or electrodes 12 and/or 16. Any gap between the rigid, curved encapsulating cover 21 or flexible substrate 11 and between the raised areas 30 or 31, if present, may be filled with a liquid material that may be cured form a solid, thereby providing additional rigidity and stability to the OLED device.

Figure 8:
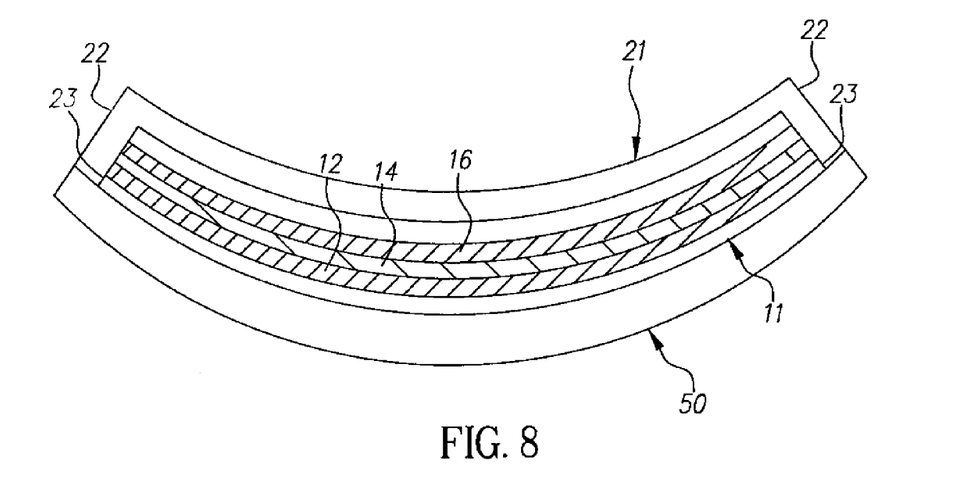
FIG. 8 is a cross section of an OLED having a curved light-emitting surface according to still another embodiment of the present invention.

Referring to FIG. 8, in an additional embodiment of the present invention, a rigid, curved substrate 50 may be employed over the flexible substrate 11 to provide additional environmental protection to the flexible substrate 11. Such a rigid curved substrate may be part of a larger apparatus and affixed when the OLED device is permanently positioned within a desired piece of equipment or it may be a separate component designed for transportation with the flexible substrate 11, layers 14, electrodes 12 and 16, and rigid, curved encapsulating cover 21.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or an electrode protection layer beneath the cover.

The various embodiments of the present invention may be employed in a variety of applications. For example, the OLED device may be a display and the one or more OLED elements are pixels. Such a display may a panoramic display having a wide-format curved viewing surface, a desktop display, or a computer monitor. Alternatively, the OLED device may be an area illumination light source. In various applications, the OLED device may be a passive-matrix display device or an active-matrix display device and, as described above may emit light through the flexible substrate 11 in a bottom-emitter configuration or through the rigid, curved encapsulating cover 21 in a top-emitter configuration.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST 10 substrate
11 flexible substrate
12 electrode
14 organic layers
16 electrode
18 power source
20 cover
21 rigid, curved encapsulating cover
22 raised edge
23 inside edge
24 bottom edge
30 flexible substrate raised area
31 encapsulating cover raised area
40 adhesive
42 desiccant
44 opening
50 connecting wire
100 form flexible substrate step
105 flatten substrate step
110 form OLED layers step
115 form rigid curved cover step
120 conform substrate step
125 seal substrate to cover step

What is claimed is:

1. A method of manufacturing an OLED device with a curved light-emitting surface comprising:
   a) forming a flexible substrate and providing the flexible substrate in a flat configuration;
   b) forming one or more OLEDs having a first electrode, one or more layers of organic material, at least one of which is light emitting formed over the first electrode, and a second electrode formed over the one or more layers of organic material, on the substrate;
   c) forming a rigid, curved, encapsulating cover;
   d) conforming the flexible substrate, electrodes, and one or more layers of organic material to the rigid, curved, encapsulating cover; and
   e) sealing the conformed flexible substrate, electrodes, and one or more layers of organic material to the rigid, curved, encapsulating cover.

2. The method of claim 1, wherein the rigid, curved encapsulating cover includes at least two opposing raised edges, and an outside edge of the flexible substrate is positioned adjacent to an inside surface of each raised edge.

3. The method of claim 2, wherein the rigid, curved encapsulating cover includes two pairs of opposing raised edges, and an outside edge of the flexible substrate is positioned adjacent to a corresponding surface of each raised edge.

4. The method of claim 2, wherein the rigid, curved encapsulating cover is sealed to the flexible substrate along the perimeter of a main surface of the flexible substrate and/or along the outside edge of the flexible substrate.

5. The method of claim 1, wherein the flexible substrate is conformed to the curved cover so that the OLEDs are on the concave side of the curved cover.

6. The method of claim 1, wherein the flexible substrate is conformed to the curved cover so that the OLEDs are on the convex side of the curved cover.

7. The method of claim 1, further including providing spacers located between the OLEDs and a main surface of the rigid, curved encapsulating cover to prevent the OLEDs from contacting the main surface of the encapsulating cover.

8. The method of claim 7, wherein the spacers comprise raised areas formed over the flexible substrate which project above the OLEDs, or raised areas formed over the main surface of the encapsulating cover.

9. The method of claim 7, wherein the spacers are formed separately and located over the OLEDs.

10. The method of claim 7, further including the step of providing an adhesive on the spacers.

11. The method of claim 1, wherein the flexible substrate is initially formed with a curved surface and subsequently compressed or tensioned to provide the flat configuration.

12. The method of claim 11, wherein the flexible substrate is initially formed with a curved surface that conforms to the rigid, curved encapsulating cover.

13. The method of claim 1, wherein the flexible substrate and/or cover comprises glass.

* * * * *